United States Patent [19]

Su et al.

[11] Patent Number: 5,576,573
[45] Date of Patent: Nov. 19, 1996

[54] STACKED CVD OXIDE ARCHITECTURE MULTI-STATE MEMORY CELL FOR MASK READ-ONLY MEMORIES

[75] Inventors: Kuan-Cheng Su, Taipei; Shing-Ren Sheu, Taoyuan, both of Taiwan

[73] Assignee: United Microelectronics Corporation, Hsinchu, Taiwan

[21] Appl. No.: 454,701

[22] Filed: May 31, 1995

[51] Int. Cl.[6] .......................... H01L 29/76; H01L 29/94; H01L 31/062; H01L 31/113
[52] U.S. Cl. .......................... 257/391; 257/390; 257/392; 257/638; 437/56; 437/59
[58] Field of Search ...................... 257/390, 391, 257/392, 638; 437/56, 59

[56] References Cited

U.S. PATENT DOCUMENTS

| | | |
|---|---|---|
| 3,829,888 | 8/1974 | Hashimoto et al. |
| 3,896,482 | 7/1975 | Brechling et al. |
| 4,658,282 | 4/1987 | Matzen, Jr. |
| 4,866,002 | 9/1989 | Shizukuishi et al. ............ 437/34 |
| 5,455,438 | 10/1995 | Hashimoto et al. ............ 257/391 |

Primary Examiner—Ngân V. Ngô
Attorney, Agent, or Firm—Ladas & Parry

[57] ABSTRACT

A multi-state memory cell for a mask ROM device. Source/drain regions are arranged on a substrate as strips extending along a first direction on the plane of the substrate and bit lines. Gate oxide layers are arranged on the substrate as strips extending along a second direction. Gate electrodes are each formed on top of each of the gate oxide layers as strips extending along the second direction. The gate oxide layers have a number of selected thickness' arranged in a differential series. Each of the transistor channel regions, together with their corresponding one of the neighboring source/drain pair, the gate oxide layer on top, and the gate electrodes further on top thereof constitute one of the memory cells that can have its threshold voltage varied among the differential series of thicknesses allowing for the storage of a multi-bit equivalent of memory content for the memory cell.

11 Claims, 4 Drawing Sheets

STACKED CVD OXIDE ARCHITECTURE MULTI-STATE MEMORY CELL FOR MASK READ-ONLY MEMORIES

BACKGROUND OF THE INVENTION

1. Field of the Invention

The present invention relates in general to a semiconductor structural configuration for memory cells of high density mask ROM devices. In particular, the present invention relates to a semiconductor structural configuration for mask ROM devices having stacked CVD oxide architecture multi-state memory cells. More particularly, the present invention relates to stacked CVD oxide architecture multi-state memory cells each capable of storing more than one bit of data for increased data storage density.

2. Technical Background

Semiconductor read-only memory (ROM) devices, in particular, masked ROMs, are enjoying the advantages resulting from miniaturization advancements in semiconductor technology. Among the most significant accomplishments is the increase in memory storage capacity. More and more memory cells can be packed into the same semiconductor die area under commercial mass production conditions. During the evolution of device miniaturization, the architectural configuration of the mask ROM memory cell has undergone a series of changes, from the traditional two-state memory cell configurations to the x-cell, the flat cell, and, lately, the modified flat cell. These cell configuration improvements have propelled commercial mask ROM devices from the 128K, through 256K, and up to the 16M, even 32M-bit storage capacity levels. All these increasing capacity mask ROM devices are being manufactured into integrated circuits having reasonable and commercially feasible chip sizes.

However, under the restrictions imposed by general rules of layout for the construction of a mask ROM memory cell based on the conditions of the available technology, it is very difficult, if not impossible, to further reduce the size of the memory cell based on a single transistor. There is, so far, no other anticipated breakthrough, such as employing some other semiconductor structural configuration, which will replace the metal-oxide semiconductor (MOS) based memory cell.

A brief examination of the semiconductor structural configuration of the memory cell of a prior art mask ROM device helps to lay the foundation for the description of the present invention. FIG. 1 of the accompanying drawings schematically shows the top view of memory cells for a conventional mask ROM device. FIG. 2 schematically shows a cross section of the memory cells as fabricated on a semiconductor substrate which is taken along the II—II line of FIG. 1. Cross-referencing to the two drawing figures simultaneously helps demonstrate the limitations inherent in the prior art mask ROM memory cell when dimensional reduction is intended.

As is shown in FIGS. 1 and 2, prior art memory cells for a mask ROM device are fabricated on semiconductor substrate 10 of P-type conductivity. Heavily N-type implantation is then conducted to form source/drain regions 14 for the cells. Source/drain regions 14 extend in the vertical direction as is observed in the top view of FIG. 1, constituting the bit lines for the memory cells. Gate electrodes 16 are then formed over gate oxide layer 12 that covers the surface of silicon substrate 10. Gate electrodes 16 extend in the horizontal direction, perpendicular to the extending direction of source/drain regions 14, as can be seen in the top view. Gate electrodes 16 constitute the word lines for the memory cells. The formation of the word lines allows the area underneath a word line and between the two neighboring bit lines to be utilized as the channel region for the memory cell transistor. The conduction state of this transistor channel, that is, its status of either conducting or blocking, is sensed as the represented information bit of either "0" or "1" respectively for a memory cell in the mask ROM device.

The channel region conduction status can be programmed to contain the required program code bit assigned to that particular memory cell. In general, to facilitate the blocking of a channel region in a memory cell, P-type impurities may be implanted within the realm of this transistor channel region 18. The process of implanting these transistor channel regions for "programming" memory code-bit contents, generally referred to as code implanting, increases the threshold voltage for the implanted channel regions 18.

Such a mask ROM device employs a transistor as the core element for each of its memory cells, which can either of the "0" or "1" data bits. The operation of the transistor, however, relies on the certain prerequisite conditions that does not allow the physical dimension of the fabricated transistor memory cells to be reduced indefinitely.

SUMMARY OF THE INVENTION

It is therefore an object of the present invention to provide a semiconductor structural configuration for memory cells of mask ROM devices having a multi-state stacked CVD oxide gate electrode architecture that allows for the storage of multi-bit data per memory cell thereof.

It is another object of the present invention to provide a semiconductor structural configuration for memory cells of mask ROM devices having a multi-state stacked CVD oxide gate electrode architecture that allows for the integration of increased storage capacity based on the same semiconductor die surface area.

The present invention achieves the above-identified objects by providing a multi-state memory cell for a mask ROM device fabricated on a semiconductor silicon substrate capable of storing the equivalent of more than one bit of data therein. The memory cell includes a number of high concentration ion-implanted source/drain regions fabricated on the substrate as strips. Each of the strips has a longitudinal axis extending along a first direction on the plane of the substrate and constitutes the bit lines for the mask ROM device. A number of gate oxide layers are formed on the substrate as strips. Each of the gate oxide strips has a longitudinal axis extending along a second direction on the plane of the substrate that is perpendicular to the first direction. The regions underneath each of the gate oxide layers and between two neighboring ones of the bit lines constitute a transistor channel region for the memory cell. A number of gate electrodes are each formed on top of each of the gate oxide layers as strips. Each of the gate electrode strips has a longitudinal axis extending along the second direction. The gate oxide layers above the transistor channel region have a number of selected thicknesses arranged in a differential series. Each of the transistor channel regions, together with its corresponding one of the neighboring source/drain pair, the gate oxide layer on top, and the gate electrodes further on top thereof constitute one of the memory cells that can have its threshold voltage varied among the differential series of thicknesses, allowing for the storage of a multi-bit equivalent of memory content for the memory cell.

Other objects, features and advantages of the present invention will become apparent by way of the following detailed description of the preferred but non-limiting embodiment.

BRIEF DESCRIPTION OF THE DRAWING

The detailed description is made with reference to the accompanying drawings, wherein.

DETAILED DESCRIPTION OF THE PREFERRED EMBODIMENTS

Referring to FIGS. 3a to 3i, cross-sectional views are shown which depict the semiconductor structural configuration of the mask ROM memory cell fabricated in accordance with a preferred embodiment of the present invention. These cross sections that are representative of the memory cell at selected process stages of the present invention.

Figure 1:
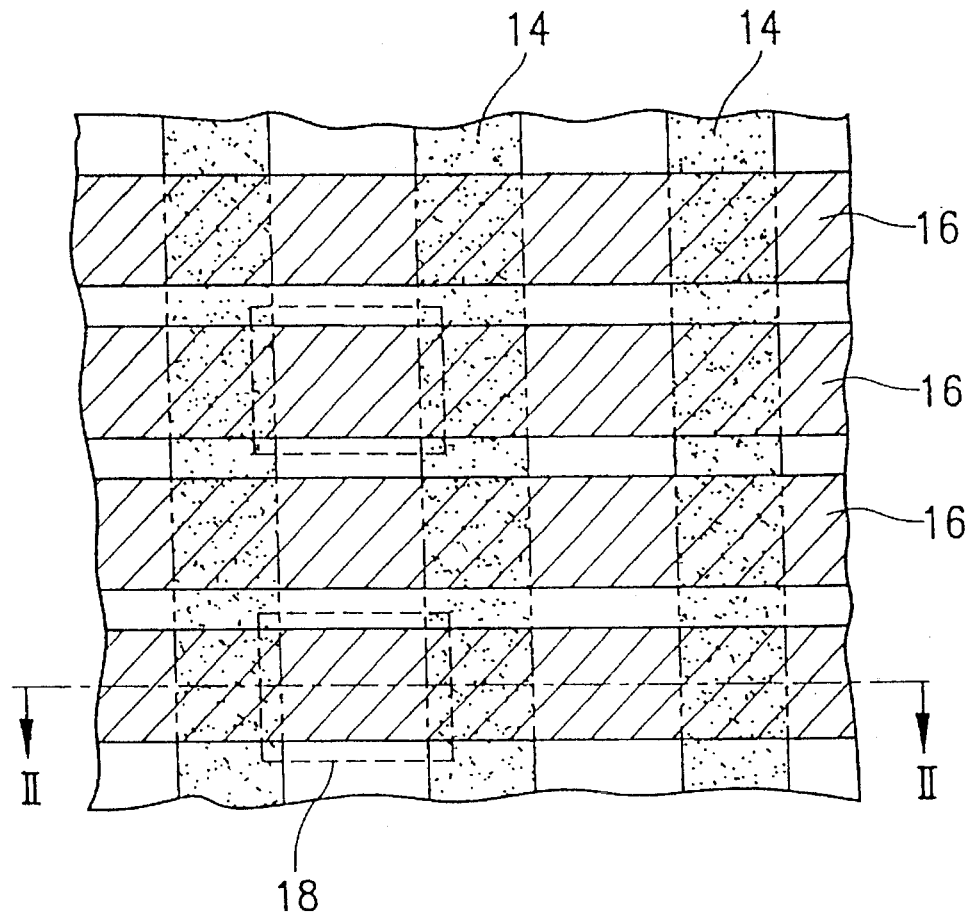
FIG. 1 schematically shows the top view of the memory cell of a conventional mask ROM device.
Figure 2:
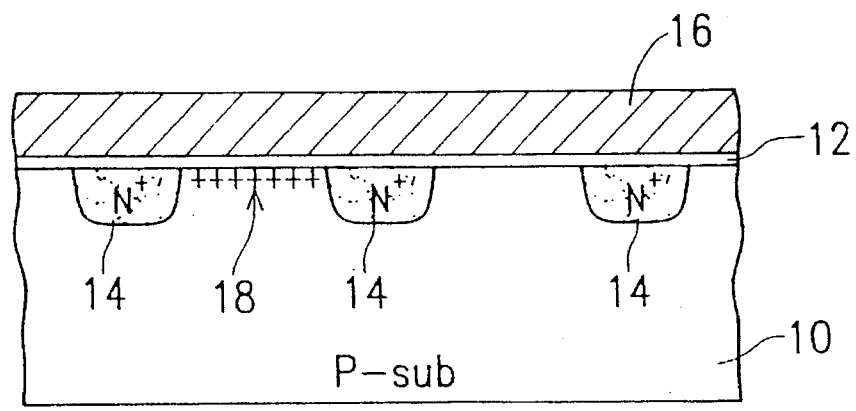
FIG. 2 schematically shows the cross-sectional view of the semiconductor structural configuration of the memory cell of FIG. 1 as taken along the II—II line.
Figure 3A:
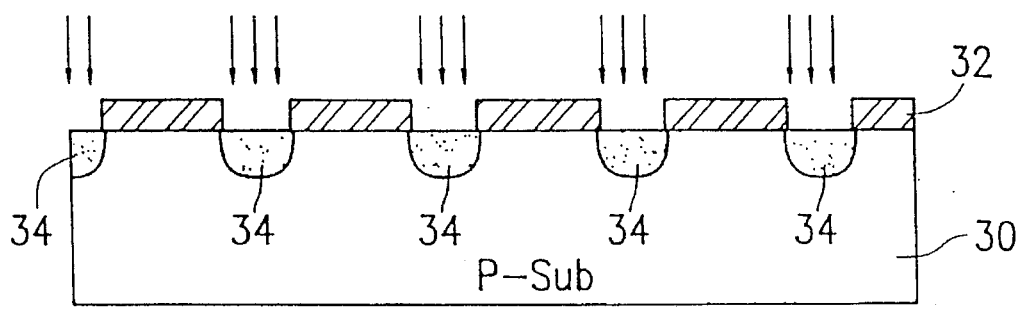
FIGS. 3a–3i schematically show the cross-sectional views of the semiconductor structural configuration of the mask ROM memory cell fabricated in accordance with a preferred embodiment of the present invention as depicted from the selected process stages thereof.

First, silicon substrate 30 of, for example, P-type conductivity, is prepared with its designated device region. Then, as is seen in FIG. 3a, layer of photoresist 32 is deployed over the surface of substrate 30 in a predetermined pattern that defines and exposes the surface areas for the source/drain regions for the memory cells. The exposed areas are then subjected to an ion implantation procedure to implant material such as, for example, arsenic (As) into a controlled depth of substrate 30. The ion implantation is implemented at an energy of, for example, 50 keV, with an achieved impurity concentration of about $5 \times 10^{14}/cm^2$. This produces $N^+$ impurity implanted regions 34 that can be utilized as the source/drain regions for the cell transistors, and, as is shown in a top view in FIG. 4, extend parallel to each other along the vertical direction. Source/drain regions 34 also serve the function of bit lines for the memory cells.

Figure 3B:
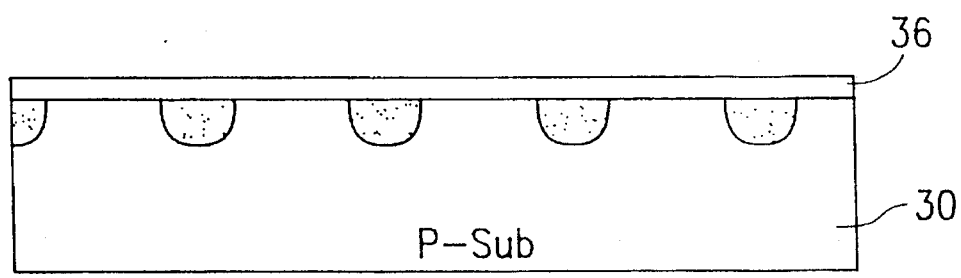

Next, photoresist layer 32 is removed, and a process of chemical vapor deposition (CVD) such as, for example, plasma-enhanced CVD (PECVD) may then be employed to form oxide layer 36 with a thickness of about 200Å, as is seen in FIG. 3b. Oxide layer 36 is then covered by photoresist 38, which is a layer prepared in accordance with a code mask which contains a pattern for the programming of selective memory cells of the mask ROM device being fabricated. Portions of the surface of the semiconductor substrate at this stage that are outside of the code programming regions are to have the covering oxide layer removed. The removal of the selected portions of oxide layer 36 is achieved by the implementation of, for example, an etching process, with the presence of photoresist layer 38 covering the designated portions of oxide layer 36. As is shown in FIG. 3c, all portions of the oxide layer not covered by photoresist layer 38 are removed by the etching process, leaving a resulting oxide layer 36.

The above-described procedures of combining the CVD and selective etching process steps can be repeatedly implemented a number of times to form more than one layer of oxides subsequently with the layer thickness controlled sufficiently precisely. This is based on the inherent characteristics of the CVD procedures, among which, high-temperature oxidation CVD (HTOCVD), low-temperature oxidation CVD (LTOCVD), plasma-enhanced CVD (PECVD), or ambient pressure CVD (APCVD) can be employed, all with sufficient precision control over the thickness of the formed oxide layer. Thus, a repeated implementation of the combined CVD oxide layer forming and selective etching procedures can be performed a number of times subsequently to form a multiple number of stacking oxide layers, each with precisely controlled layer thickness. The stacked oxide layers can, however, be considered as a single layer of oxide, with a thickness being the sum of each of the constituent layers formed in the subsequent CVD procedures.

Figure 3C:
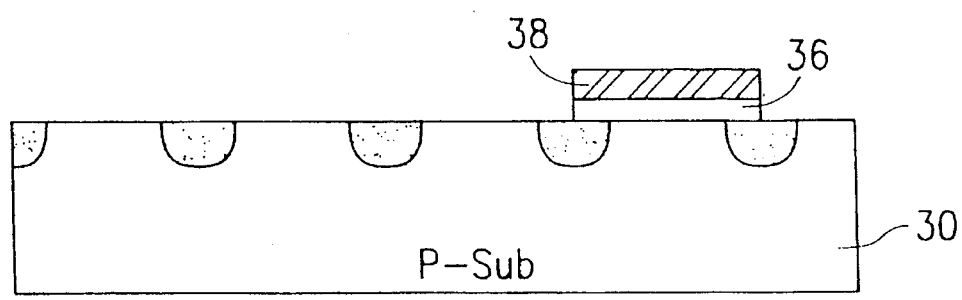
Figure 3D:
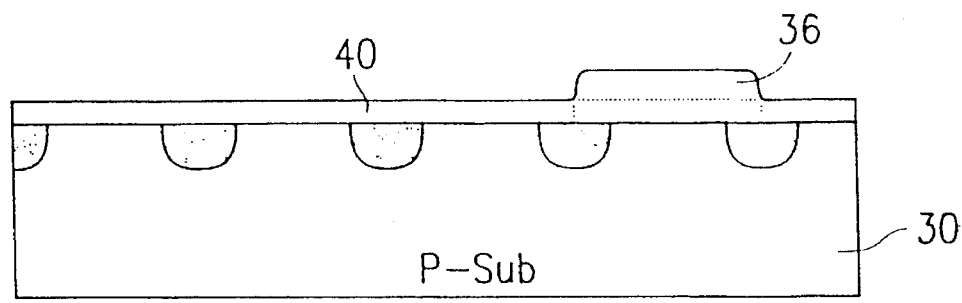

For example, after the selective etching of the first oxide layer to form residual oxide layer 36 as in FIG. 3c, photoresist layer 38 can then be removed before another CVD process is implemented to form second oxide layer 40. As is seen in FIG. 3d, the second CVD process results in the increase of the thickness of oxide layer 36, covering the original oxide layer formed in the previous procedure as identified by the phantom line. At this stage, although oxide layers 36 and 40 are considered to be of the same construction of a single piece of oxide formed by subsequent CVD procedures, they have, however, different thickness, with the portion designated by reference numeral 36 thicker than that of the portion identified by reference numeral 40.

Figure 3E:
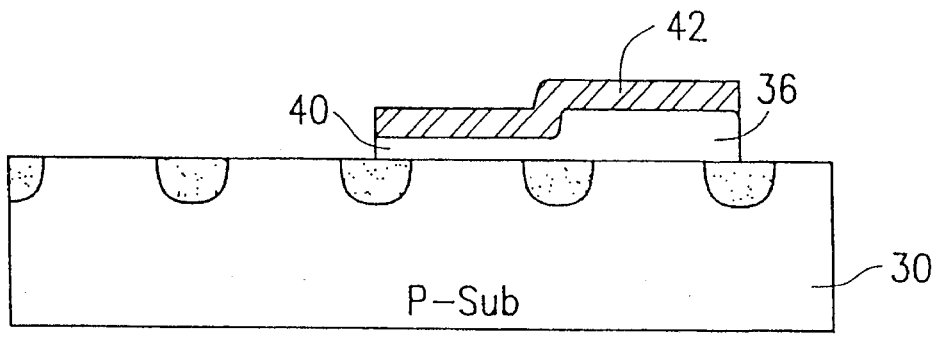

Then, in FIG. 3e, the application of another photoresist 42 is formed, and a subsequent etching procedure similar to the one described above is then employed to form thicker oxide layer 36 together with the lower-stepped portion of layer 40. The resulting oxide layer is thus a stepped structural configuration as is clearly observed in the cross-sectional view of FIG. 3e. The thickness' of two steps 36 and 40 of the resulting oxide layer are about 400Å and 200Å respectively.

Figure 3F:
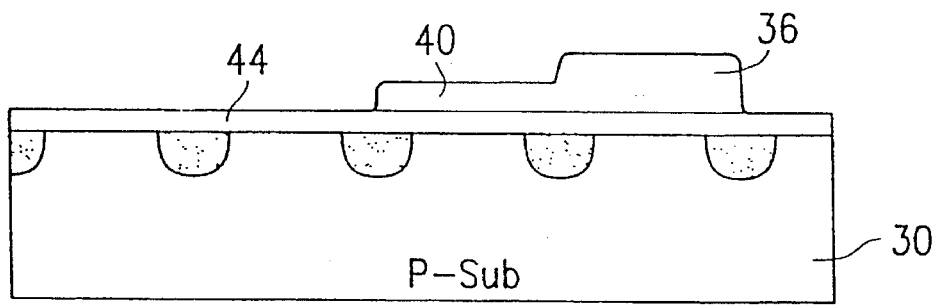
Figure 3G:
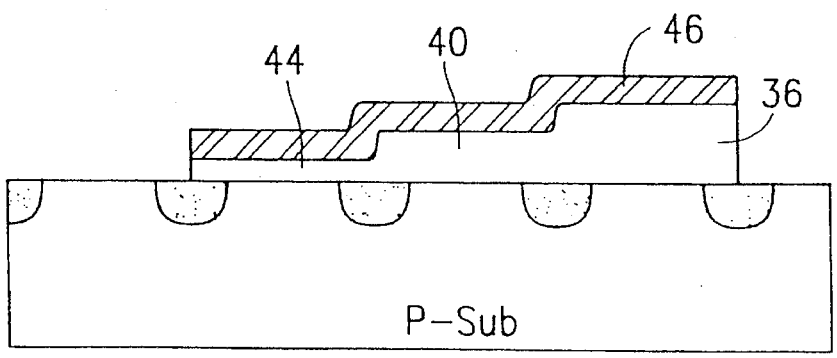

Next, the third code masking CVD/etching procedure can be implemented. Referring to FIGS. 3f and 3g, third CVD is implemented to form the oxide layer that covers both oxide layer 36 and 40 of FIG. 3e. As is seen in FIG. 3f, oxide layers 36 and 40 are further grown, with additional layer 44 covering the exposed surface of substrate 30. Third photoresist layer 46 is then formed on the oxide layer to facilitate the etching of the oxide layer that results in oxide layers 36, 40 and 44 as shown in FIG. 3g. At this stage, the thickness of oxide layers 36, 40 and 44 are about 600Å, 400Å and 200Å respectively.

Figure 3H:
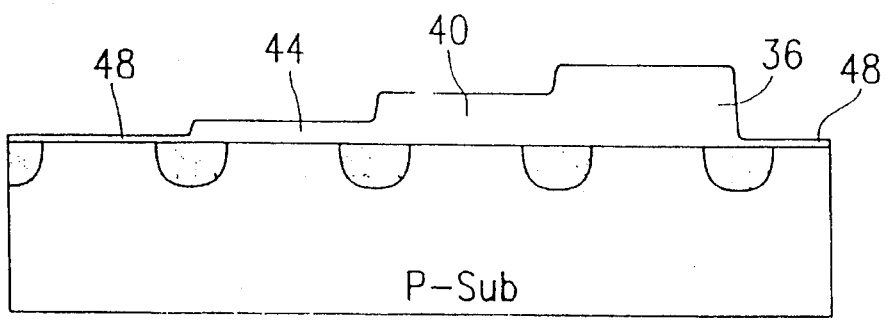
Figure 3I:
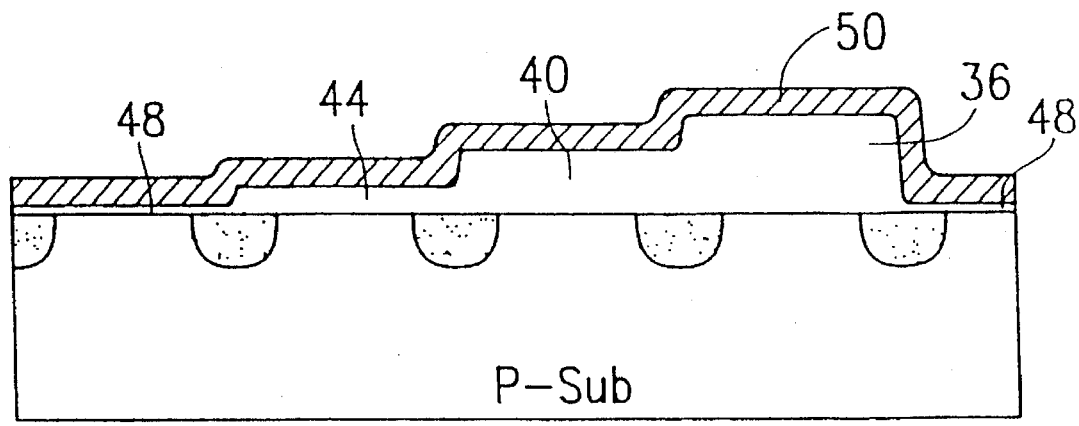
Figure 4:
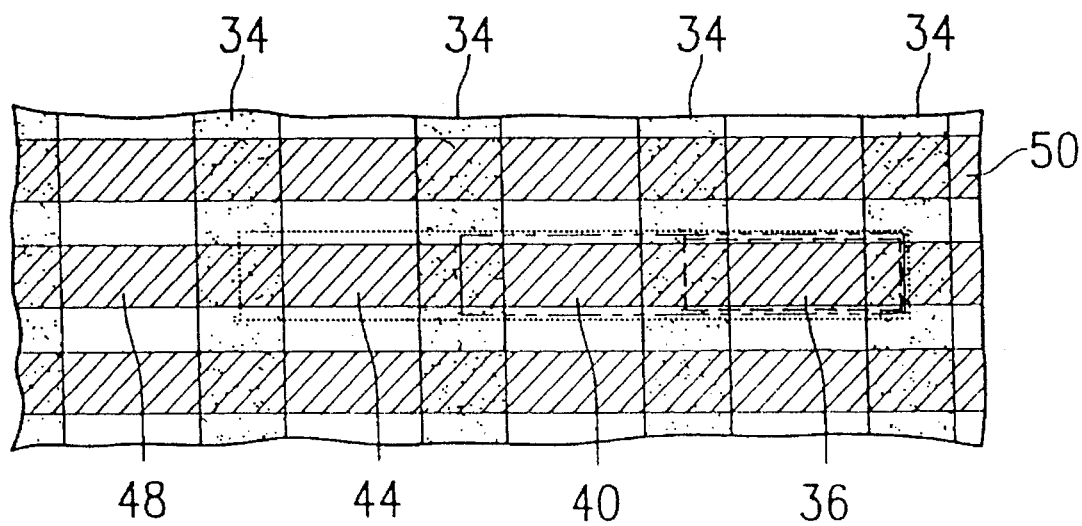
FIG. 4 schematically shows the top view of the memory cell of the mask ROM of the preferred embodiment of the present invention.

Then, referring to FIGS. 3h and 3i, after the removal of photoresist layer 46, an oxidation process is performed to form oxide layer 48 with a thickness of about 150 covering the non-coding regions of the substrate surface. At this stage, the entire oxide layer is shaped into a configuration having four steps 36, 40, 44 and 48 as shown in the cross-sectional view of FIG. 3h. The thickness of steps 36, 40, 44 and 48 are 660, 470, 280 and 150Å respectively. The oxidation process further increases the thickness' of previously-formed steps 36, 40 and 44. A comparison with the top view of FIG. 4 shows that the steps 36, 40, 44 and 48 are aligned along the horizontal direction of the surface of the substrate which is perpendicular to the longitudinal direction of the multiple of source/drain regions 34.

Finally, as is shown in FIG. 3i, a process of forming a polysilicon layer is performed followed by an etching process that forms gate electrodes 50, covering the stepped structural configuration of the substrate surface architecture. At this stage, the basic process for fabrication of the memory cell may be considered to be complete, although, as persons skilled in this art may appreciate, subsequent procedural steps of forming the insulating layer, preparation of the contact windows, as well as the formation of the metal contact layers are required for a mask ROM device.

A memory cell of a mask ROM device includes basically a cell transistor having a transistor channel region and a pair of source/drain terminal regions connected therewith, and the gate electrode oxide layer above the transistor body, as well as its accompanying gate electrode. The gate electrode may be fabricated from the material of, for example, polysilicon, or metal oxides of the polysilicon. The mask ROM device consisting of the memory cells fabricated by the process described above, featuring this basic structural architecture, while having a gate oxide layer that is varied in thickness as fabricated and described above, may therefore have four selectable critical voltages for the four gate oxide layer thickness'.

In the case of the preferred embodiment as described above, having the four stepped thickness of 150, 280, 470 and 660 respectively, the threshold voltages involved in the programming of one such memory cell would be 0.94, 1.77, 2.92 and 4.13 volts respectively. This allows the generation of four possible values of transistor channel current, depending on the selective mask programming of the particular memory cell. With the proper arrangement in an accompanying sense amplifier for the "reading" of the memory cell contents, the four possible different transistor currents may be interpreted as four different pieces of information that may be stored in one memory cell. The sense amplifier may be designed to translate the four possible transistor currents into four values each represented by a two-bit output of the mask ROM device. Thus, each of the memory cells of the mask ROM of the present invention is capable of storing two bits of data, one bit more than an equivalent conventional mask ROM memory cell. The embodiment of the present invention thereby provides a two-fold increase in the storage capacity of the mask ROM device.

With the implementation of more CVD-based code masking procedures, more than two bit-equivalent memory cells are possible, which results in an increase of device storage capacity without the corresponding device size increase.

Furthermore, since the present invention employs no ion implantation procedures for the code masking during the fabrication of the memory cells, the semiconductor memory device thus fabricated has better temperature control characteristics compared to prior art mask ROM devices. Nor is there the problem of electrical drifting because of the thermal diffusion effect of the channel region ions, also characteristic of prior art devices.

In addition, the precision that may be achieved by controlling the thickness of the fabricated oxide layers helps to achieve precision control over the critical voltages involved in the programming of the memory cell contents. The precision of the memory cell code content may be directly translated into reliable multi-state memory cell storage/access operations.

The description herein of the present invention explains a preferred embodiment. However, persons skilled in this art can appreciate that other similar arrangements can be devised from the embodiment disclosed above without departing from the spirit of the present invention. Details of the other constituent components of a complete mask ROM integrated circuit device, for example, the data sensing section, as well as the differential amplifier, which are varied due to the specific details of the implementation of a ROM device, are not herein described. Persons skilled in this art, after reading the above descriptions, should be familiar with the proper selection and implementation of these sections when they are to be implemented together with the inventive memory cell structural configuration of the present invention.

What is claimed is:

1. A multi-state memory cell for a mask ROM device on a semiconductor silicon substrate, said memory cell comprising:

a plurality of source/drain region strips, each one of said plurality of source/drain region strips having a longitudinal axis extending along a first direction on said substrate and constituting a bit line for said mask ROM device;

a plurality of gate oxide layer strips formed over said substrate, each one of said plurality of gate oxide layer strips having a longitudinal axis extending along a second direction perpendicular to said first direction, the regions underneath each of said gate oxide layer strips and between two neighboring bit lines constituting the transistor channel region for said memory cell; and a plurality of gate electrodes each formed on each of said gate oxide layers strips, each one of said plurality of gate electrodes having a longitudinal axis extending along said second direction;

wherein each of said gate oxide layer strips above said transistor channel region have a plurality of selected thicknesses arranged in a differential series, and wherein each said transistor channel region, together with a corresponding one of a neighboring source/drain pair, corresponding gate oxide layer strips, and corresponding gate electrode, constitute one of said memory cells having a variable threshold voltage among said selected thicknesses arranged in a differential series to allow for storage of a multi-bit equivalent of memory content for said memory cell.

2. The multi-state memory cell for a mask ROM device of claim 1, wherein said selected thicknesses arranged in a differential series include four thicknesses of 150, 280, 470 and 660, constituting an equivalent of two bits of four values of memory cell storage content for each of said memory cells.

3. The multi-state memory cell for a mask ROM device of claim 1, wherein said selected thicknesses arranged in a differential series include more than four thicknesses constituting an equivalent of more than two bits of a plurality of values of memory cell storage content for each of said memory cells.

4. The multi-state memory cell for a mask ROM device of claim 1, wherein said gate electrodes are made of polysilicon.

5. The multi-state memory cell for a mask ROM device of claim 1, wherein said gate electrodes are made of metal oxide of polysilicon.

6. A process for fabricating a multi-state memory cell for a mask ROM device on a semiconductor substrate, said process comprising the steps of:

forming a plurality of source/drain region strips on said substrate, each one of said plurality of source/drain region strips having a longitudinal axis extending along a first direction on a plane of said substrate and constituting a bit line for said mask ROM device;

forming a plurality of date oxide layer strips on said substrate each having a longitudinal axis extending along a second direction on said plane of said substrate that is perpendicular to said first direction, the regions underneath each of said gate oxide layer strips and between two neighboring ones of said bit lines constituting a transistor channel region for said memory cell, said gate oxide layers above said transistor channel region having a plurality of selected thicknesses arranged in a differential series; and forming a plurality of gate electrodes, each of said gate electrodes being formed on each of said gate oxide layer strips and each having a longitudinal axis extending along said second direction;

wherein each said transistor channel region, together with a corresponding one of a neighboring source/drain pair, corresponding gate oxide layers, and a corresponding gate electrode, constitute one of said memory cells having a variable critical electric potential among said selected thicknesses arranged in a differential series to allow for storage of a multi-bit equivalent of memory content for said memory cell.

7. The process for fabricating a multi-state memory cell for mask ROM device of claim 6, wherein the step of forming a plurality of gate oxide layer strips includes the step of performing a sequence of chemical vapor deposition to form said selected thicknesses arranged in a differential series.

8. The process for fabricating a multi-state memory cell for mask ROM device of claims 7, wherein the step of performing said sequence of chemical vapor deposition procedures includes at least one chemical vapor deposition procedure and one thermal oxidation procedure for forming a stepped oxide layer of at least two steps.

9. The process for fabricating a multi-state memory cell for mask ROM device of claim 7, wherein the step of performing said sequence of chemical vapor deposition procedures includes three chemical vapor deposition procedures each depositing an oxide layer of 200Å thickness and one thermal oxidation procedure, said three chemical vapor deposition and one thermal oxidation procedure forming a stepped oxide layer of four steps having step thicknesses of about 150, 280, 470 and 660 respectively.

10. The process for fabricating multi-state memory cell for mask ROM device of claim 6, wherein the step of forming a plurality of gate electrodes includes the step of forming a plurality of gate electrodes made of polysilicon.

11. The process for fabricating multi-state memory cell for mask ROM device of claim 6, wherein the step of forming a plurality of gate electrodes includes the step of forming a plurality of said gate electrodes made of metal oxide of polysilicon.

* * * * *